US012597929B2

(12) United States Patent
Labrecque et al.

(10) Patent No.: US 12,597,929 B2
(45) Date of Patent: Apr. 7, 2026

(54) RESETTABLE LEVEL SHIFTING LATCH

(71) Applicant: QUALCOMM Incorporated, San Diego, CA (US)

(72) Inventors: Peter Normand Labrecque, Austin, TX (US); Sayan Ganguly, Austin, TX (US); Samer Ghanem, Austin, TX (US)

(73) Assignee: QUALCOMM INCORPORATED, San Diego, CA (US)

( * ) Notice: Subject to any disclaimer, the term of this patent is extended or adjusted under 35 U.S.C. 154(b) by 106 days.

(21) Appl. No.: 18/821,349

(22) Filed: Aug. 30, 2024

(65) Prior Publication Data

US 2026/0066904 A1     Mar. 5, 2026

(51) Int. Cl.
*H03K 19/0185*     (2006.01)
*H03K 3/037*     (2006.01)
*H03K 3/356*     (2006.01)
*H03K 3/3562*     (2006.01)

(52) U.S. Cl.
CPC ... *H03K 19/018521* (2013.01); *H03K 3/0372* (2013.01); *H03K 3/356191* (2013.01); *H03K 3/35625* (2013.01)

(58) Field of Classification Search
CPC ... H03K 19/018521; H03K 19/018528; H03K 19/01855; H03K 3/0372; H03K 3/356104–356139; H03K 3/356182–35625
See application file for complete search history.

(56) References Cited

U.S. PATENT DOCUMENTS

| | | | | |
|---|---|---|---|---|
| 9,893,726 | B1 * | 2/2018 | Katakwar | .......... H03K 19/0013 |
| 10,819,319 | B1 * | 10/2020 | Hyde | ................. G06K 19/0715 |
| 11,962,303 | B1 * | 4/2024 | Dao | ................. H03K 19/01855 |
| 2001/0013795 | A1 | 8/2001 | Nojiri | |

OTHER PUBLICATIONS

International Search Report and Written Opinion PCT/US2025/042041 ISA/EPO Dec. 3, 2025.

* cited by examiner

*Primary Examiner* — Patrick O Neill
(74) *Attorney, Agent, or Firm* — Loza & Loza, LLP

(57) ABSTRACT

An apparatus, including: a level shifter configured to: receive an input data signal in a first voltage domain; receive a reset signal in a second voltage domain; and generate an intermediate signal in the second voltage domain based on the input data signal and the reset signal; and a resettable latch configured to generate an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

20 Claims, 4 Drawing Sheets

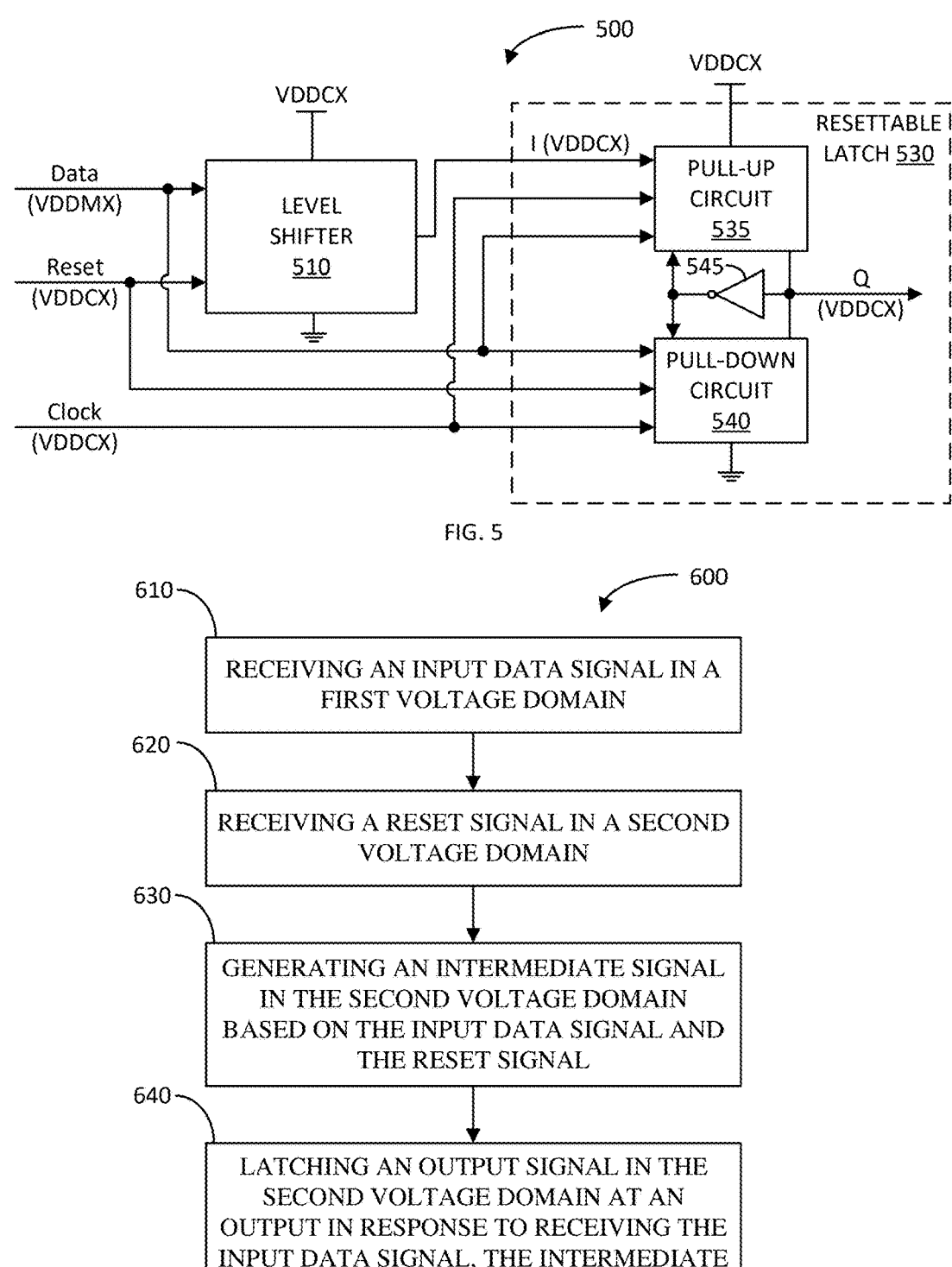

610 ─ RECEIVING AN INPUT DATA SIGNAL IN A FIRST VOLTAGE DOMAIN

620 ─ RECEIVING A RESET SIGNAL IN A SECOND VOLTAGE DOMAIN

630 ─ GENERATING AN INTERMEDIATE SIGNAL IN THE SECOND VOLTAGE DOMAIN BASED ON THE INPUT DATA SIGNAL AND THE RESET SIGNAL

640 ─ LATCHING AN OUTPUT SIGNAL IN THE SECOND VOLTAGE DOMAIN AT AN OUTPUT IN RESPONSE TO RECEIVING THE INPUT DATA SIGNAL, THE INTERMEDIATE SIGNAL, THE RESET SIGNAL, AND A CLOCK SIGNAL IN THE SECOND VOLTAGE DOMAIN, THE OUTPUT SIGNAL BEING BASED ON LOGIC STATES OF THE INPUT DATA SIGNAL, THE INTERMEDIATE SIGNAL, THE RESET SIGNAL, AND THE CLOCK SIGNAL

FIG. 6

RESETTABLE LEVEL SHIFTING LATCH

FIELD

This disclosure relates generally to level shifters, and in particular, to a resettable level shifting latch capable of a single device delay between a data input and a data output, a single device delay between a clock input and the data output, and a single device delay between a reset input and the data output.

BACKGROUND

An integrated circuit (IC), such as a system on chip (SOC), typically includes different types of circuits operating under different voltage domains. Often, such different circuits need to transfer data between each other. In this regard, the IC typically includes level shifters to voltage level shift data in a first voltage domain under which the source of the data operates to a second voltage domain under which the destination of the data operates. To improve the rate at which data is transferred from the source device to the destination device, the delay associated with the level shifters should be kept relatively small.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus, includes: a level shifter configured to: receive an input data signal in a first voltage domain; receive a reset signal in a second voltage domain; and generate an intermediate signal in the second voltage domain based on the input data signal and the reset signal; and a resettable latch configured to generate an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

Another aspect of the disclosure relates to a method. The method includes receiving an input data signal in a first voltage domain; receiving a reset signal in a second voltage domain; generating an intermediate signal in the second voltage domain based on the input data signal and the reset signal; and latching an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 5 illustrates a block diagram another example resettable level shifting latch in accordance with another aspect of the disclosure.

FIG. 6 illustrates a flow diagram of an example method of level shifting an input data signal and latching an output data signal in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
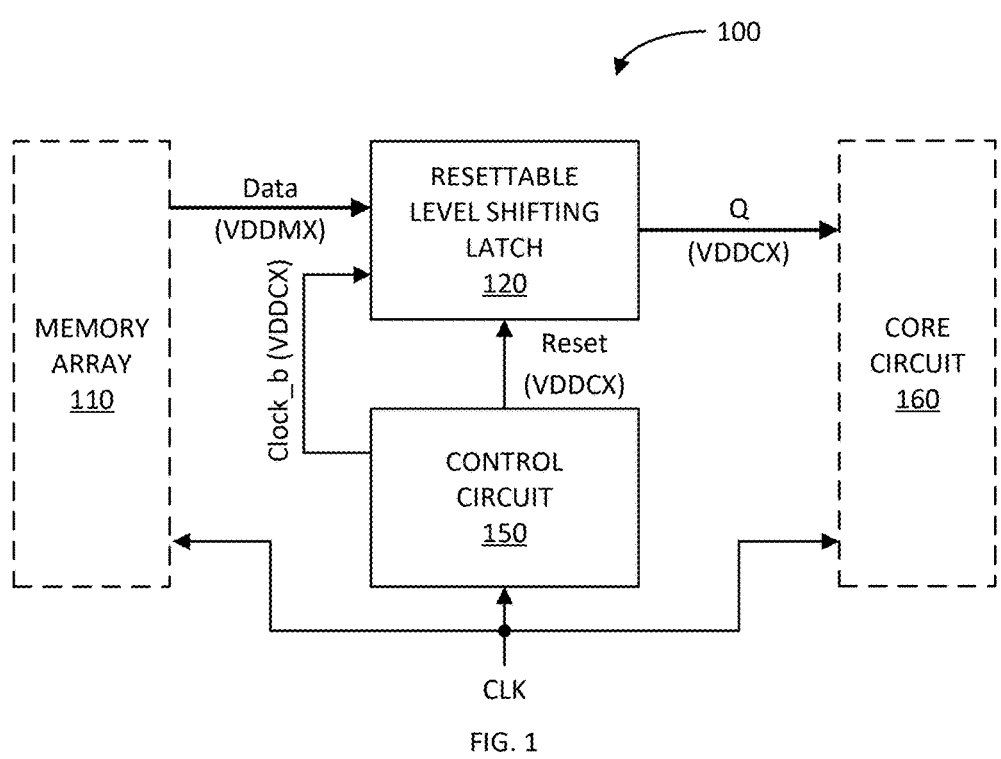
FIG. 1 illustrates a block diagram of an example memory array to core interface circuit in accordance with an aspect of the disclosure.

FIG. 1 illustrates a block diagram of an example memory array to core interface circuit 100 (hereinafter, "memory-core interface circuit 100") in accordance with an aspect of the disclosure. The memory-core interface circuit 100 is configured to voltage domain interface a memory array 110 on a memory voltage domain VDDMX to a core circuit 160 on a core voltage domain VDDCX. The memory-core interface circuit 100 includes a resettable level shifting latch 120 and an associated control circuit 150.

The memory array 110 is configured to output data in accordance with the memory voltage domain VDDMX. The data may have been requested for processing by the core circuit 160 of an integrated circuit (IC), such as a system on chip (SOC), a processing unit, etc. The core circuit 160 may process the data in accordance with the core voltage domain VDDCX, which may be different (e.g., higher or lower) than the memory voltage domain VDDMX.

The resettable level shifting latch 120 is configured to level shift an input data signal in the memory voltage domain VDDMX from the memory array 110 and latch a corresponding output (Q) data signal in the core voltage domain VDDCX. The output (Q) data signal may be provided to the core circuit 160 for further processing. The control circuit 150 is configured to generate a clock signal "Clock_b" and a reset signal "Reset," both in the core voltage domain VDDCX. The memory array 110, the control circuit 150, and the core circuit 160 may operate synchronously with respect to an input or primary clock signal CLK, which may be a substantially periodic square wave signal with a 50 percent (%) duty cycle.

In operation, when the Reset signal is deasserted (e.g., at a logic zero (0)) and the Clock_b signal is a logic one (1), the resettable level shifting latch 120 is configured to latch the output (Q) data signal in the core voltage domain VDDCX as a logic zero (0) in response to a rising transition of the input data signal in the memory voltage domain VDDMX and subsequent falling and rising transitions of the Clock_b signal. When the Reset signal is deasserted (e.g., at a logic zero (0)) and the input data signal in the memory voltage domain VDDMX is a logic zero (0), the resettable level shifting latch 120 is configured to latch the output (Q) data signal in the core voltage domain VDDCX as a logic one (1) in response to a falling transition of the Clock_b signal. The Clock_b signal may also be a substantially periodic square wave although its duty cycle need not be 50% (e.g., higher than 50%). When the Reset signal is asserted (e.g., at a logic one (1)), the resettable level shifting latch 120 outputs a logic zero (0) regardless of the logic state of the input data signal or the Clock_b signal.

Figure 2:
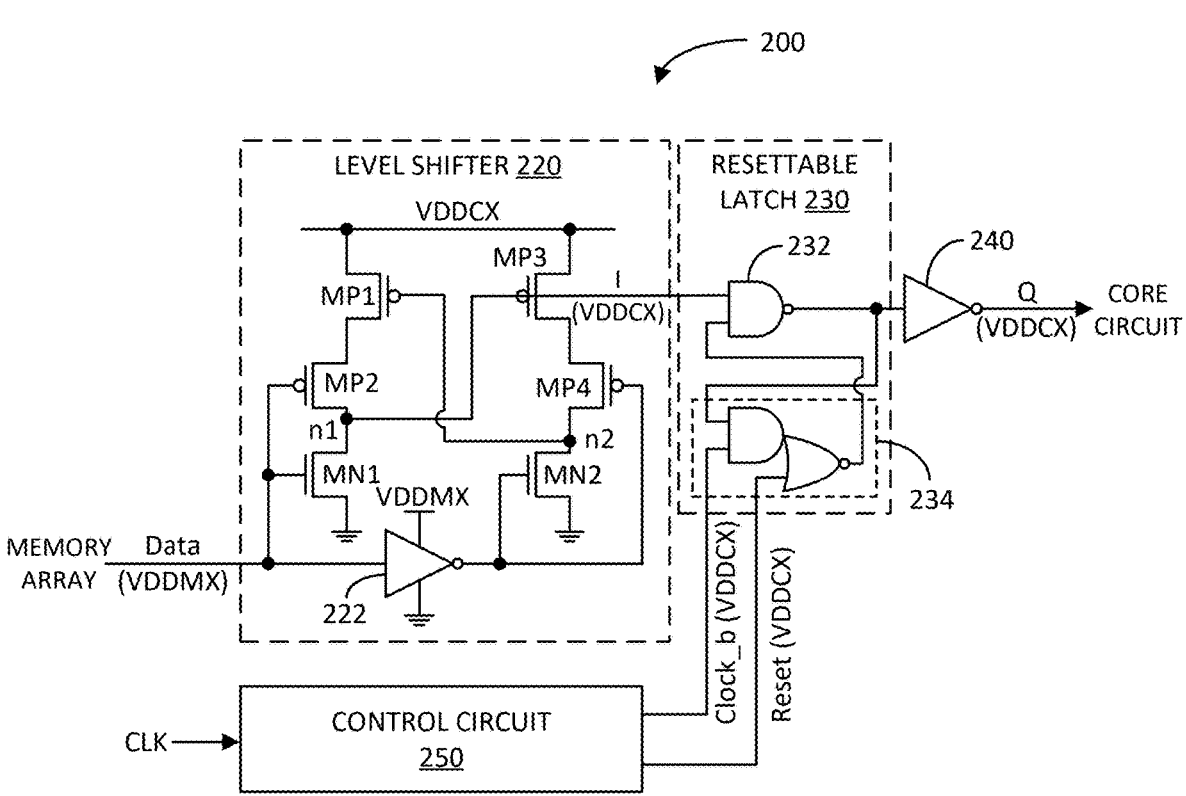
FIG. 2 illustrates a block/schematic diagram of another example memory array to core circuit interface in accordance with another aspect of the disclosure.

FIG. 2 illustrates a block/schematic diagram of an example memory array to core circuit interface 200 (hereinafter, "memory-core interface circuit 200") in accordance with another aspect of the disclosure. The memory-core interface circuit 200 may be an example more detailed implementation of the memory-core interface circuit 100 previously discussed. Similarly, the memory-core interface circuit 200 is configured to voltage domain interface a memory array on a memory voltage domain VDDMX to a core circuit on a core voltage domain VDDCX. The memory-core interface circuit 200 includes a level shifter 220, a resettable latch 230, an inverter 240, and a control circuit 250. Both the level shifter 220 and the resettable latch 230 may be collectively referred to as a resettable level shifting latch.

The level shifter 220 is configured to level shift an input data signal in a memory voltage domain VDDMX (received from the memory array) to generate an intermediate (I) (or unlatched) data signal in a core voltage domain VDDCX. In this regard, the level shifter 220 includes first, second, third, and fourth p-channel field effect transistors (PFETs) MP1-MP4, first and second n-channel (NFETs) MN1-MN2, and an inverter 222 operating under the memory voltage domain VDDMX.

The first and second PFETs MP1-MP2 and the first NFET MN1 are coupled in series between an upper (core) voltage rail VDDCX and a ground rail. That is, the first PFET MP1 includes a source coupled to the upper voltage rail VDDCX, and a drain coupled to a source of the second PFET MP2. The second PFET MP2 includes a drain coupled to a drain of the first NFET MN1. The first NFET MN1 includes a source coupled to the ground rail.

The third and fourth PFETs MP3-MP4 and the second NFET MN2 are coupled in series between the upper voltage rail VDDCX and the ground rail. That is, the third PFET MP3 includes a source coupled to the upper voltage rail VDDCX, and a drain coupled to a source of the fourth PFET MP4. The fourth PFET MP4 includes a drain coupled to a drain of the second NFET MN2. The second NFET MN2 includes a source coupled to the ground rail.

The third PFET MP3 includes a gate coupled to a first node n1 between the respective drains of the second PFET MP2 and the first NFET MN1. The first PFET MP1 includes a gate coupled to a second node n2 between the respective drains of the fourth PFET MP4 and the second NFET MN2. The second PFET MP2 and the first NFET MN1 include gates coupled together and to an input of the inverter 222, all of which are configured to receive an input data signal in the memory voltage domain VDDMX from the memory array. The fourth PFET MP4 and the second NFET MN2 include gates coupled together and to an output of the inverter 222. The inverter 222 is configured to invert the input data signal in the memory voltage domain VDDMX, and provide an inverted data signal, also in the memory voltage domain VDDMX, to the gates of the fourth PFET MP4 and the second NFET MN2.

The resettable latch 230 includes a NAND gate 232 cross-coupled with an AND-OR-INVERT (AOI) gate 234. In particular, the NAND gate 232 includes a first input configured to receive an intermediate (I) data signal from an output of the level shifter 220. The NAND gate 232 includes a second input coupled to an output of the AOI gate 234. The NAND gate 232 includes an output coupled to a first (AND) input of the AOI gate 234. The AOI gate 234 includes a second (AND) input coupled to a clock output of the control circuit 250 to receive a clock signal "Clock_b" in the core voltage domain VDDCX. Additionally, the AOI gate 234 includes a third (NOR) input coupled to a reset output of the control circuit 250 to receive a reset signal "Reset" in the core voltage domain VDDCX. Finally, the inverter 240 includes an input coupled to an output of the resettable latch 230 at the output of the NAND gate 232, and an output coupled to the core circuit. As previously discussed, the Clock_b and Reset signals, including the input data signal, may be synchronous with respect to an input or primary clock signal CLK.

In operation, assuming the Clock_b signal is a logic one (1), the Reset signal is deasserted (e.g., a logic zero (0)), and the internal node of the resettable latch 230 (e.g., at the second input of the NAND gate 232) is initialized to a logic one (1), if the input data signal exhibits a rising transition (e.g., a transition from a logic zero (0) to a logic one (1)), the input data signal turns ON the first NFET MN1 and the fourth PFET MP4 via the inverter 222, turns OFF the second NFET MN2 via the inverter 222, and may partially turn OFF the second PFET MP2 (e.g., for the case where the memory voltage domain VDDMX is lower than the core voltage domain VDDCX, and the high logic voltage of the memory voltage domain VDDMX is not high enough to fully turn OFF the second PFET MP2).

The turned-on first NFET MN1 pulls down the voltage at the output (drain of the first NFET MN1) of the level shifter 220 to generate the intermediate (I) data signal as a logic zero (0). The gate of the third PFET MP3 being pulled down via the turned-on first NFET MN1 causes the third PFET MP3 to turn ON. As both the third and fourth PFETs MP3-MP4 are turned ON, the supply voltage at the upper voltage rail VDDCX is applied to the gate of the first PFET aMP1 via the second node n2; thereby, turning OFF the first PFET MP1. The turned-off first PFET MP1 substantially isolates the pulled-down drain of the first NFET MN1 from the upper voltage rail VDDCX (as the second PFET MP2 may not be fully turned OFF).

As the internal node of the resettable latch 230 is initialized to a logic one (1), the resettable latch 230 is transparent allowing the falling intermediate (I) data signal to propagate to the output of the NAND gate 232 as a logic one (1) in the core voltage domain VDDCX. At such time, the resettable latch 230 becomes temporarily opaque, and subsequently fully opaque to latch the inverted intermediate (I) data signal in response to falling and rising transitions of the Clock_b signal. The inverter 240 inverts the latched inverted intermediate (I) data signal to generate an output (Q) data signal as a logic zero (0) in the core voltage domain VDDCX. Thus, in this example, the logic polarity of the output (Q) data signal in the core voltage domain VDDCX is opposite to that of the input data signal in the memory voltage domain VDDMX.

When the input data gets pre-discharged and hence exhibits a falling transition (e.g., a transition from a logic one (1) to a logic zero (0)), the input data signal turns ON the second PFET MP2 and the second NFET MN2 via the inverter 222, turns OFF the first NFET MN1, and may partially turn OFF the fourth PFET MP4 via the inverter 222 (again, as the inverter 222 may operate under the memory voltage domain VDDMX, its high logic voltage may not be high enough to fully turn OFF the fourth PFET MP4).

The turned-on second NFET MN2 pulls down the voltage at the gate of the first PFET MP1; thereby, turning ON the first PFET MP1. As the first and second PFETs MP1-MP2 are turned ON, the output (drain of the first NFET MN1) of the level shifter 220 generates the intermediate (I) data signal as a logic one (1) in the core voltage domain VDDCX. The gate of the third PFET MP3 being pulled up to VDDCX causes the third PFET MP3 to turn OFF. The turned-off third PFET MP3 substantially isolates the pulled-down gate of the first PFET MP1 via the second node n2 from the upper voltage rail VDDCX (as the fourth PFET MP4 may not be fully turned OFF).

Given that the internal latch node is at a logic zero (0), the intermediate (I) data signal cannot propagate through. Once the Clock_b signal transitions to a logic zero (0), it causes the internal latch node to transition to a logic one (1), which makes the NAND gate 232 output to transition to a logic zero (0) causing the resettable latch to become transparent. Then, the resettable latch 230 subsequently becomes opaque and latches the logic zero (0) in response to a following rising transition of the Clock_b signal. The inverter 240 inverts the latched signal to generate an output (Q) data signal as a logic one (1). Similarly, in this example, the logic polarity of the output (Q) data signal in the core voltage domain VDDCX is opposite to that of the input data signal in the memory voltage domain VDDMX.

With regard to the Reset signal, when it is deasserted, the input data signal and the Clock_b signal control the transparent/opaque state of the resettable latch 230. When the Reset signal is asserted to a logic one (1), it causes the AOI gate 234 to output a logic zero (0). The logic zero (0) outputted by the AOI gate 234 causes the NAND gate 232 to output a logic one (1). The inverter 240 inverts the logic one (1) to generate the output (Q) as a logic zero (0). Thus, when the Reset signal is asserted, the memory-core interface circuit 200 outputs a logic zero (0) regardless of the states of the input data signal and the Clock_b signal.

A drawback of the memory-core interface circuit 200 is that the respective delays between the rising transition on the input data signal and the falling transition on the output (Q) data signal, a falling transition on the Clock_b signal and a rising transition on the output (Q) data signal, and a rising transition on the Reset signal and a falling transition on the output (Q), each involve three (3) delay stages. For example, the rising transition of the input data signal to the falling transition of the output (Q) data signal delay involves a first delay stage due to the level shifter 220, a second delay stage due to the resettable latch 230, and a third delay stage due to the inverter 240. Similarly, the falling transition of the Clock_b signal to the rising transition of the output (Q) data signal involves a first delay stage due to the AOI gate 234, a second delay stage due to the NAND gate 232, and a third delay stage due to the inverter 240. In a like manner, the Reset signal becoming asserted to the output (Q) becoming a logic zero (0) involves a first delay stage due to the AOI gate 234, a second delay stage due to the NAND gate 232, and a third delay stage due to the inverter 240. Accordingly, it may be desirable to reduce the number of delay stages for the aforementioned scenarios to improve the speed of resettable level shifting latches that interface circuits operating under different voltage domains.

Figure 3:
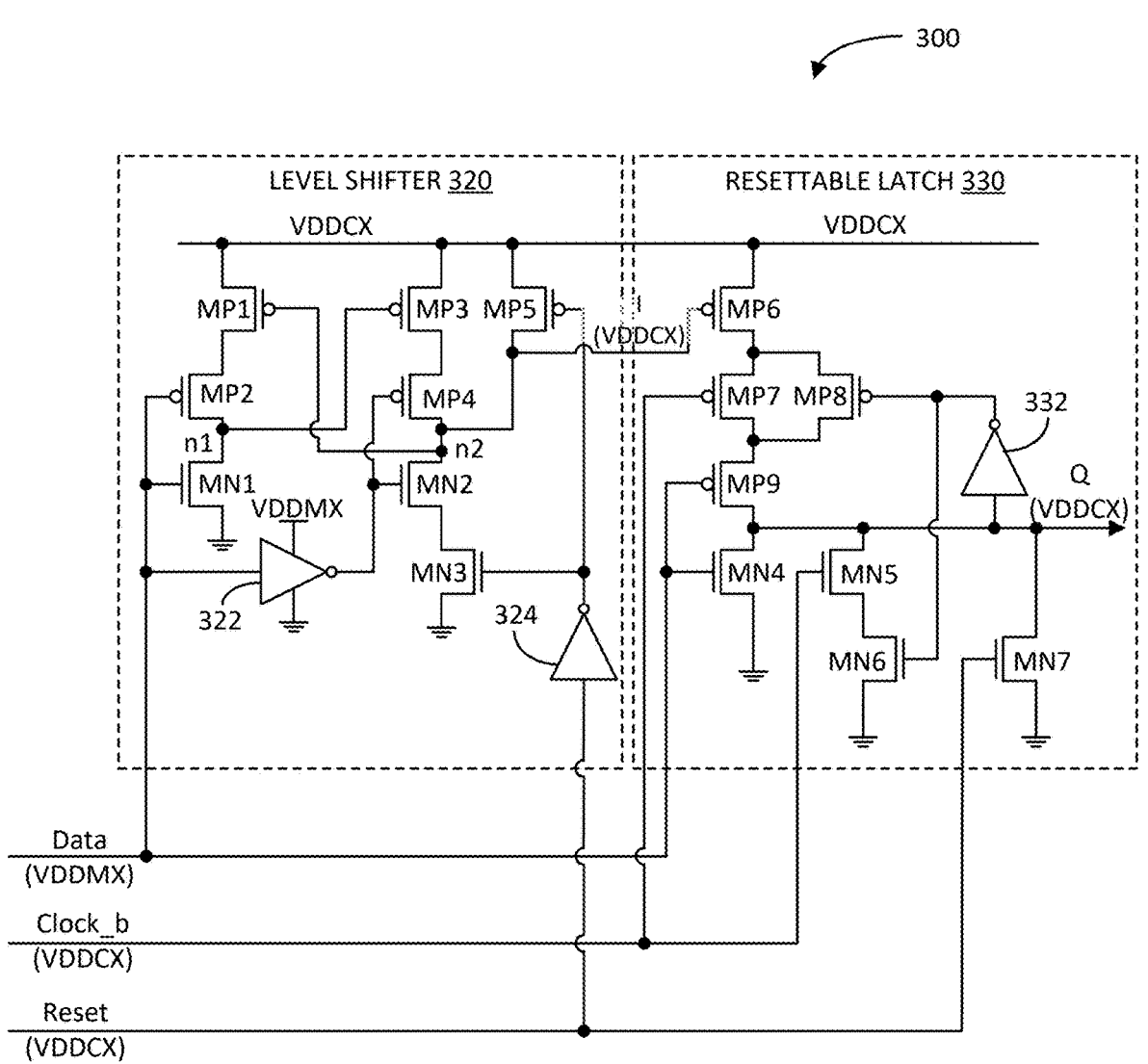
FIG. 3 illustrates a block/schematic diagram of an example resettable level shifting latch in accordance with another aspect of the disclosure.

FIG. 3 illustrates a block/schematic diagram of an example resettable level shifting latch 300 in accordance with another aspect of the disclosure. In this example, the resettable level shifting latch 300 is configured to voltage domain interface a memory array on a memory voltage domain VDDMX to a core circuit on a core voltage domain VDDCX. The resettable level shifting latch 300 includes a level shifter 320 and a resettable latch 330. As discussed further herein, the reset and output inverter functionality are integrated into the level shifter 320 and resettable latch 330 to achieve a single device delay between the rising transition of the input data signal and the falling transition of the output (Q) data signal, the falling transition of the Clock_b signal and the rising transition of the output (Q) data signal, and the Reset signal becoming asserted (e.g., transitioning to a logic one (1)) and the output (Q) signal transitioning to a logic zero (0).

From a high-level perspective, the operation of the resettable level shifting latch 300 is as follows: assuming the Clock_b signal is a logic one (1) and the Reset signal is deasserted (e.g., at a logic zero (0)), the level shifter 320 is configured to maintain a pull-up circuit in the resettable latch 330 disabled in response to a rising transition of the input data signal in a memory voltage domain VDDMX. For example, if the input data signal transitions to a logic one (1), the level shifter 320 is configured to maintain the pull-up circuit in the resettable latch 330 disabled even when the Clock_b signal subsequently becomes a logic zero (0); allowing an output of the resettable latch 330 to be maintained pulled down by the logic one (1) of the input data signal to generate an output (Q) data signal as a logic zero (0) in a core voltage domain VDDCX. When the input data signal is at a logic zero (0), the level shifter 320 allows the enabling of the pull-up circuit in response to a falling transition of the Clock_b signal. The level shifter 320 is also configured to disable the pull-up circuit in the resettable latch 330 in response to an asserted Reset signal (e.g., a logic one (1)) in the core voltage domain VDDCX.

The input data signal, Clock_b signal, and Reset signal directly control a pull-down circuit in the resettable latch 330. For example, when the Clock_b signal is a logic one (1) and the Reset signal is deasserted (e.g., a logic zero (0)), the pull-down circuit in the resettable latch 330 is enabled in response to a rising transition of the input data signal to pull-down the output of the resettable latch 320 to set the output (Q) data signal to a logic zero (0). When the Reset signal is asserted (e.g., a logic one (1)), the pull-down circuit in the resettable latch 330 is enabled to pull down the output of the resettable latch 330 so as to set the output (Q) signal to a logic zero (0).

More specifically, the level shifter 320 is similar to level shifter 220 previously discussed, including the first, second, third, and fourth PFETs MP1-MP4, the first and second NFETs MN1-MN2, and the inverter 322 operating under the memory voltage domain VDDMX in the same arrangement with a few exceptions as discussed further herein. The level shifter 320 differs from level shifter 220 in that it includes additional devices responsive to the Reset signal. In particular, the level shifter 320 further includes an inverter 324 operating under the core voltage domain VDDCX, a fifth PFET MP5, and a third NFET MN3.

The fifth PFET MP5 includes a source coupled to the upper (core) voltage rail VDDCX and a drain coupled to the second node n2 between the respective drains of the fourth PFET MP4 fand the second NFET MN2. The second node n2 also serves as the output of the level shifter 320 instead of the drain of the first NFET NI as in level shifter 220. The third NFET MN3 includes a drain coupled to the source of the second NFET MN2 and a source coupled to the ground rail. Thus, another difference between level shifter 320 and level shifter 220 is that the source of the second NFET MN2 is not directly coupled to the ground rail, but rather via the third NFET MN3. The inverter 324 includes an input coupled to a control circuit (not shown in FIG. 3) to receive the Reset signal, and an output coupled to the gates of the fifth PFET MP5 and the third NFET MN3.

The resettable latch 330, in turn, includes a pull-up circuit including sixth, seventh, eighth, and ninth PFETs MP6-MP9, a pull-down circuit including fourth, fifth, sixth, and seventh NFETs MN4-MN7, and an inverter 332 operating under the core voltage rail VDDCX.

More specifically, with regard to the pull-up circuit, the sixth, seventh, and ninth PFETs MP6, MP7, and MP9 are coupled in series between the upper (core) voltage rail VDDCX and an output of the resettable latch 330. That is, the sixth PFET MP6 includes a source coupled to the upper voltage rail VDDCX, and a drain coupled to a source of the seventh PFET MP7. The seventh PFET MP7 includes a drain coupled to a source of the ninth PFET MP9. The eighth PFET MP8 is coupled in parallel with the seventh PFET MP7. That is, the eighth PFET MP8 includes source and drain coupled to the source and drain of the seventh PFET MP7, respectively. The ninth PFET MP9 includes a drain coupled to the output of the resettable latch 330. The sixth PFET MP6 includes a gate coupled to an output of the level shifter 320 at the second node n2 between the respective drains of the fourth PFET MP4 and second NFET MN2. The seventh PFET MP7 includes a gate coupled to the control circuit to receive the Clock_b signal. The ninth PFET MP9 includes a gate coupled to the memory array (not shown in FIG. 3) to receive the input data signal in the memory voltage domain VDDMX.

With regard to the pull-down circuit, the fourth NFET MN4 is coupled between the output of the resettable latch 330 and the ground rail. That is, the fourth NFET MN4 includes a drain coupled to the output of the resettable latch 330, and a source coupled to the ground rail. The fifth and sixth NFETs MN5-MN6 are coupled in series between the output of the resettable latch 330 and the ground rail. That is, the fifth NFET MN5 includes a drain coupled to the output of the resettable latch 330 and a source coupled to the drain of the sixth NFET MN6. The sixth NFET MN6 includes a source coupled to the ground rail. The seventh NFET MN7 is coupled between the output of the resettable latch 330 and the ground rail. That is, the seventh NFET MN7 includes a drain coupled to the output of the resettable latch 330, and a source coupled to the ground rail. The fourth NFET MN4 includes a gate coupled to the memory array to receive the input data signal in the memory voltage domain VDDMX. The fifth NFET MN5 includes a gate coupled to the control circuit to receive the Clock_b signal. The seventh NFET MN7 includes a gate coupled to the control circuit to receive the Reset signal.

With regard to cross-coupling of the pull-up circuit with the pull-down circuit to form the latch, the inverter 332 includes an input coupled to the output of the resettable latch 330, and an output coupled to a gate of the eighth PFET MP8 and to a gate of the sixth NFET MN6. The operation of the resettable level shifting latch 300 is discussed further herein with reference to a timing diagram depicted in FIG. 4. In the following operation discussion, it will be shown that the resettable level shifting latch 300 may achieve a single delay stage between: (1) the input data signal rising to a logic one (1) and the output (Q) data signal responsibly falling to a logic zero (0); (2) the Clock_b signal falling to a logic zero (0) and the output (Q) data signal responsibly rising to a logic one (1); and (3) the Reset signal becoming asserted (e.g., rising to a logic one (1)) and the output (Q) transitioning to a logic zero (0).

Figure 4:
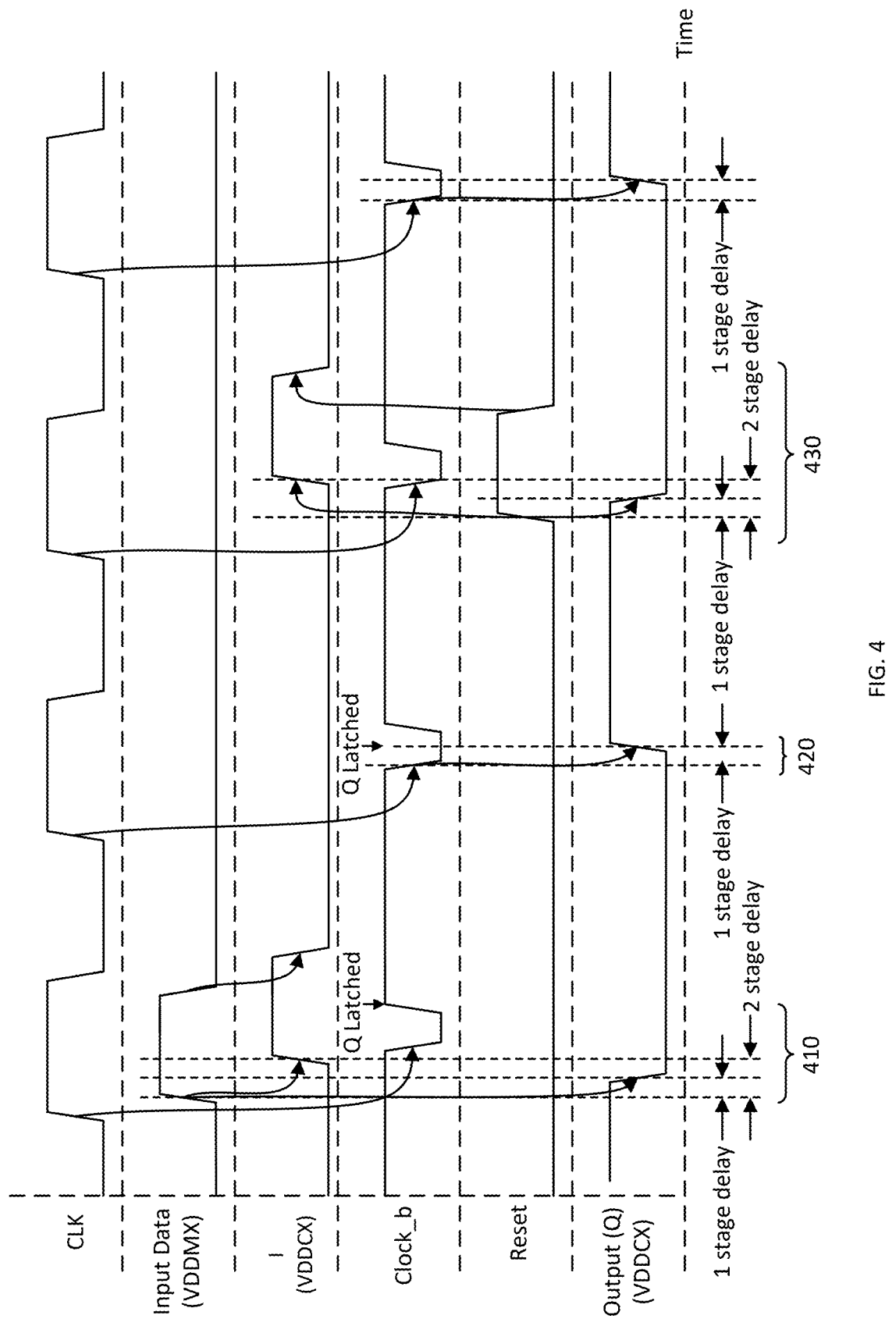
FIG. 4 illustrates a timing diagram associated with an example operation of the resettable level shifting latch of FIG. 3 in accordance with another aspect of the disclosure.

FIG. 4 illustrates a timing diagram associated with the resettable level shifting latch 300 in accordance with another aspect of the disclosure. The horizontal axis of the timing diagram represents time. The vertical axis, from top to bottom, represents the states of the input or primary clock signal CLK, the input data signal in the memory voltage domain VDDMX, the intermediate (I) signal generated by the level shifter 320, the Clock_b signal, the Reset signal, and the output (Q) data signal. With particular interest, the timing diagram depicts three events: when the memory input data signal transitions to a logic one (1) and the output (Q) data signal responsibly transitions to a logic zero (0) 410, when the Clock_b signal transitions to a logic zero (0) and the output (Q) data signal responsibly transitions to a logic one (1) 420, and when the Reset signal becomes asserted (e.g., transitions to a logic one (1)) and the output (Q) signal responsibly transitions to a logic zero (0) 430.

With reference to both FIGS. 3-4, in accordance with the first event 410, when the input data signal transitions to a logic one (1) shortly after a rising transition of the input or primary clock signal CLK, at such time the Clock_b signal is at a logic one (1) and the Reset signal is deasserted at a logic zero (0). In response to the input data signal transitioning to a logic one (1), the fourth NFET MN4 of the resettable latch 330 turns ON, and pulls down the output of the resettable latch 330 (e.g., couples the output to the ground rail) to generate the output (Q) data signal as a logic zero (0). Note that this involves a single delay stage, namely, the turning ON of the fourth NFET MN4 of the resettable latch 330. The Clock_b signal being a logic one (1) has the fifth NFET MN5 of the resettable latch 330 turned ON. The output (Q) data signal transitioning to a logic zero (0) turns on the sixth NFET MN6 via the inverter 332.

The Reset signal being deasserted at a logic zero (0) has the fifth PFET MP5 turned OFF and the third NFET MN3 turned ON, both via the inverter 324. The turned-on third NFET MN3 couples the source of the second NFET MN2 to the ground rail. Thus, the Reset signal being deasserted at a logic zero (0) functionally configures the level shifter 320 substantially the same as level shifter 220 previously discussed. The Reset signal being deasserted at a logic zero (0) also has the seventh NFET MN7 turned OFF.

The level shifter 320, in response to the input data signal transitioning to the logic one (1) per the first event 410, generates the intermediate (I) data signal as a logic one (1) by turning ON the third PFET MP3 via the turned-on first NFET MN1, and turning ON the fourth PFET MP4 via the logic zero (0) outputted by the inverter 322 responsive to the high input data signal. The high intermediate (I) data signal turns OFF the sixth PFET MP6 of the resettable latch 330 to maintain the pull-up circuit (MP6-MP9) of the resettable latch 330 disabled (e.g., decouple the output from the upper voltage rail VDDCX) when the Clock_b signal subsequently transitions to a logic zero (0), and thereby prevents current leakage therethrough as the logic one (1) of the input data signal may not be high enough to fully turn OFF the ninth PFET MP9. Note that the intermediate (I) data signal transitioning to the logic one (1) in response to the input data signal transitioning to the logic one (1) involves a two-stage delay, namely the first NFET MN1/inverter 322, and the PFETs MP3/MP4.

Further, as discussed, the Clock_b signal subsequently transitions to a logic zero (0) and then back to a logic one (1) to fully latch the output (Q) data signal. That is, the Clock_b signal transitioning to a logic one (1) turns on NFET MN5. As the output (Q) is already at a logic zero (0), the inverter 332 inverts the logic zero (0) to a logic one (1), which, being applied to the gate of the sixth NFET MN6. Accordingly, the NFETs MN5-MN6 turned on latches the output (Q) data signal at a logic zero (0). This allows the input data signal to transition back to a logic zero (0) without affecting the latched output (Q) data signal.

In accordance with the second event 420, when the Clock_b signal transitions to a logic zero (0), the input data signal has been pre-discharged to a logic zero (0) since a previous clock cycle (e.g., since approximately the falling transition of the input or primary clock signal CLK). The Reset signal is also still deasserted at a logic zero (0). The input data signal being at a logic zero (0) turns ON the ninth PFET MP9 of the resettable latch 330, and also causes the level shifter 320 to generate the intermediate (I) data signal as a logic zero (0) to turn ON the sixth PFET MP6 of the resettable latch 330. Thus, when the Clock_b signal transitions to a logic zero (0), the seventh PFET MP7 turns ON, and enables the pull-up circuit (MP6, MP7, and MP9) to pull up the output (Q) to a logic one (1) (e.g., couple the output to the upper voltage rail VDDCX). Note that the Clock_b signal transitioning to the logic zero (0) and the output (Q) transitioning to a logic one (1) involves a single delay stage, namely, the turning ON of the seventh PFET MP7. The output (Q) transitioning to a logic one (1) also turns ON the eighth PFET MP8 via the inverter 332 to latch the output (Q) signal at a logic one (1).

In accordance with the third event 430, the Reset signal becomes asserted and transitions to a logic one (1). In response to the Reset signal transitioning to the logic one (1), the seventh NFET MN7 turns ON to pull down the output of the resettable latch 330 to a logic zero (0) (e.g., couple the output to the ground rail). Note that this involves a single delay stage, namely, the turning ON of the seventh NFET MN7. Also, in response to the Reset signal transitioning to the logic one (1), the fifth PFET MP5 turns ON and the third NFET MN3 turns OFF, both via the inverter 324. The turning ON of the fifth PFET MP5 causes the intermediate (I) signal to become a logic one (1), which turns OFF the sixth PFET MP6 to disable the pull-up circuit (e.g., decouple the output from the upper voltage rail VDDCX) to prevent or reduce current leakage into the pull-down output of the resettable latch 330. The disabling of the pull-up circuit in response to the Reset signal transitioning to a logic one (1) involves a two-stage delay, namely, the inverter 324 and the turning ON of the fifth PFET MP5. When the Reset signal subsequently transitions to a logic zero (0), the level shifter 320 responsibly transitions the intermediate signal to a logic zero (0).

FIG. 5 illustrates a block diagram an example resettable level shifting latch 500 in accordance with another aspect of the disclosure. The resettable level shifting latch 500 includes a level shifter 510 configured to: receive an input data signal in a first voltage domain (e.g., VDDMX), receive a reset signal in a second voltage domain (e.g., VDDCX), and generate an intermediate (I) signal in the second voltage domain based on the input data signal and the reset signal. The resettable level shifting latch 500 further includes a resettable latch 530 configured to generate an output (Q) signal in the second voltage domain in response to receiving the input data signal, the intermediate signal, the reset signal, and a clock signal in the second voltage domain, the output signal being based on logic states of the input data signal, the intermediate signal, the reset signal, and the clock signal, respectively.

The resettable latch 530 may include a pull-up circuit 535 configured to couple/decouple the output to/from an upper voltage rail associated with the second voltage domain (e.g., VDDCX) based on the input data signal, the intermediate signal, and the clock signal. The resettable latch 530 may further include a pull-down circuit 540 configured to couple/decouple the output to/from ground associated with the second voltage domain (e.g., VDDCX) based on the input data signal, the reset signal, and the clock signal. The resettable latch 530 may include an inverter 545 including an input coupled to the output of the resettable latch 530 and an output coupled to the pull-up circuit 535 and the pull-down circuit 540 to effectuate the cross-coupling of the pull-up and pull-down circuits 535 and 540.

FIG. 6 illustrates a flow diagram of an example method 600 of level shifting an input data signal and latching an output data signal in accordance with another aspect of the disclosure. The method 600 includes receiving an input data signal in a first voltage domain (e.g., VDDMX) (block 610). The method 600 further includes receiving a reset signal in a second voltage domain (e.g., VDDCX) (block 620). Additionally, the method 600 includes generating an intermediate signal in the second voltage domain based on the input data signal and the reset signal (block 630). Examples of means for generating an intermediate signal in the second voltage domain based on the input data signal include the level shifters 320 and 510.

The method 600 further includes latching an output signal in the second voltage domain at an output in response to receiving the input data signal, the reset signal, and a clock signal in the second voltage domain, the output signal being based on logic states of the input data signal, the intermediate signal, the reset signal, and a clock signal, respectively (block 640). Examples of means for latching an output signal in the second voltage domain at an output in response to receiving the input data signal, the reset signal, and a clock signal in the second voltage domain, the output signal being based on logic states of the input data signal, the intermediate signal, the reset signal, and a clock signal, respectively, include resettable latches 330 and 530.

The following provides an overview of aspects of the present disclosure:

Aspect 1: An apparatus, comprising: a level shifter configured to: receive an input data signal in a first voltage domain; receive a reset signal in a second voltage domain; and generate an intermediate signal in the second voltage domain based on the input data signal and the reset signal; and a resettable latch configured to generate an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

Aspect 2: The apparatus of aspect 1, wherein the resettable latch comprises: a pull-up circuit configured to couple/decouple the output to/from an upper voltage rail associated with the second voltage domain based on the input data signal, the intermediate signal, and the clock signal; and a pull-down circuit configured to couple/decouple the output to/from a ground rail based on the input data signal, the reset signal, and the clock signal.

Aspect 3: The apparatus of aspect 2, wherein the pull-up circuit is configured to couple the output to the upper voltage rail in response to the input data signal being at a first logic state, the intermediate signal being at a second logic state, and the clock signal being at a third logic state.

Aspect 4: The apparatus of aspect 3, wherein the first, second, and third logic states are each a logic zero (0).

Aspect 5: The apparatus of any one of aspects 2-4, wherein the pull-up circuit is configured to decouple the output from the upper voltage rail in response to one or more of the following: the input data signal being at a first logic state, the intermediate signal being at a second logic state, or the clock signal being at a third logic state.

Aspect 6: The apparatus of aspect 5, wherein the first, second, and third logic states are each a logic one (1).

Aspect 7: The apparatus of aspect 5 or 6, wherein the level shifter is configured to generate the intermediate signal with the second logic state in response to the reset signal being asserted.

Aspect 8: The apparatus of any one of aspects 2-7, wherein the pull-down circuit is configured to couple the output to the ground rail in response to one or both of the following: the input data signal being at a logic state or the reset signal being asserted.

Aspect 9: The apparatus of aspect 8, wherein the logic state is a logic one (1).

Aspect 10: The apparatus of any one of aspects 2-8, wherein the pull-down circuit is configured to decouple the output from the ground rail in response to the clock signal transitioning to a logic state.

Aspect 11: The apparatus of aspect 10, wherein the logic state is a logic zero (0).

Aspect 12: The apparatus of any one of aspects 2-11, wherein the pull-up circuit comprises a first p-channel field effect transistor (PFET), a second PFET, and a third PFET coupled in series between the upper voltage rail and the output of the resettable latch, wherein: the first PFET includes a gate configured to receive the intermediate signal from the level shifter, the second PFET includes a gate configured to receive the clock signal, and the third PFET includes a gate configured to receive input data signal.

Aspect 13: The apparatus of aspect 12, wherein the pull-up circuit further includes a fourth PFET coupled in parallel with the second PFET, and wherein the resettable latch further comprises an inverter including an input coupled to the output of the resettable latch and an output coupled to a gate of the fourth PFET.

Aspect 14: The apparatus of any one of aspects 2-13, wherein the pull-down circuit comprises: a first n-channel field effect transistor (NFET) coupled between the output of the resettable latch and the ground rail, wherein the first NFET includes a gate configured to receive the input data signal; a second NFET coupled between the output of the resettable latch and the ground rail, wherein the second NFET includes a gate configured to receive the clock signal; and a third NFET coupled between the output of the resettable latch and the ground rail, wherein the third NFET includes a gate configured to receive the reset signal.

Aspect 15: The apparatus of aspect 14, wherein the pull-down circuit further includes a fourth NFET coupled between the second NFET and the ground rail, and wherein the resettable latch further comprises an inverter including an input coupled to the output of the resettable latch and an output coupled to a gate of the fourth NFET.

Aspect 16: The apparatus of any one of aspects 1-15, wherein the level shifter comprises: a first p-channel field effect transistor (PFET), a second PFET, and a first n-channel field effect transistor (NFET) coupled in series between an upper voltage rail and a ground rail, wherein the second PFET and the first NFET include gates configured to receive the input data signal; a first inverter including an input configured to receive the input data signal; a second inverter including an input configured to receive the reset signal; a third PFET, a fourth PFET, a second NFET, and a third NFET coupled in series between the upper voltage rail and the ground rail, wherein: the third PFET includes a gate coupled to a first node between the second PFET and the first PFET, the fourth PFET includes a gate coupled to an output of the first inverter, the second NFET includes a gate coupled to the output of the first inverter, and the third NFET includes a gate coupled to an output of the second inverter; and a fifth PFET including a source coupled to the upper voltage rail and a drain coupled to a second node between the fourth PFET and the second NFET, wherein the fifth PFET includes a gate coupled to the output of the second inverter.

Aspect 17: A method, comprising: receiving an input data signal in a first voltage domain; receiving a reset signal in a second voltage domain; generating an intermediate signal in the second voltage domain based on the input data signal and the reset signal; and latching an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

Aspect 18: The method of aspect 17, wherein latching the output signal comprises latching the output signal as a logic one (1) in response to the clock signal transitioning to a logic zero (0) when the input data signal and the intermediate signal are both at a logic zero (0).

Aspect 19: The method of aspects 17 or 18, wherein latching the output signal comprises latching the output signal as a logic zero (0) in response to the clock signal transitioning to a logic one (1) when the input data signal and the intermediate signal are both at a logic one (1).

Aspect 20: The method of any one of aspects 17-19, further comprising setting the output to a logic zero (0) in response to the reset signal becoming asserted.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:

a level shifter configured to:

receive an input data signal in a first voltage domain;

receive a reset signal in a second voltage domain; and generate an intermediate signal in the second voltage domain based on the input data signal and the reset signal; and a resettable latch configured to generate an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

2. The apparatus of claim 1, wherein the resettable latch comprises:

a pull-up circuit configured to couple/decouple the output to/from an upper voltage rail associated with the second voltage domain based on the input data signal, the intermediate signal, and the clock signal; and a pull-down circuit configured to couple/decouple the output to/from a ground rail based on the input data signal, the reset signal, and the clock signal.

3. The apparatus of claim 2, wherein the pull-up circuit is configured to couple the output to the upper voltage rail in response to the input data signal being at a first logic state, the intermediate signal being at a second logic state, and the clock signal being at a third logic state.

4. The apparatus of claim 3, wherein the first, second, and third logic states are each a logic zero (0).

5. The apparatus of claim 2, wherein the pull-up circuit is configured to decouple the output from the upper voltage rail in response to one or more of the following: the input data signal being at a first logic state, the intermediate signal being at a second logic state, or the clock signal being at a third logic state.

6. The apparatus of claim 5, wherein the first, second, and third logic states are each a logic one (1).

7. The apparatus of claim 5, wherein the level shifter is configured to generate the intermediate signal with the second logic state in response to the reset signal being asserted.

8. The apparatus of claim 2, wherein the pull-down circuit is configured to couple the output to the ground rail in response to one or both of the following: the input data signal being at a logic state or the reset signal being asserted.

9. The apparatus of claim 8, wherein the logic state is a logic one (1).

10. The apparatus of claim 2, wherein the pull-down circuit is configured to decouple the output from the ground rail in response to the clock signal transitioning to a logic state.

11. The apparatus of claim 10, wherein the logic state is a logic zero (0).

12. The apparatus of claim 2, wherein the pull-up circuit comprises a first p-channel field effect transistor (PFET), a second PFET, and a third PFET coupled in series between the upper voltage rail and the output of the resettable latch, wherein: the first PFET includes a gate configured to receive the intermediate signal from the level shifter, the second PFET includes a gate configured to receive the clock signal, and the third PFET includes a gate configured to receive input data signal.

13. The apparatus of claim 12, wherein the pull-up circuit further includes a fourth PFET coupled in parallel with the second PFET, and wherein the resettable latch further comprises an inverter including an input coupled to the output of the resettable latch and an output coupled to a gate of the fourth PFET.

14. The apparatus of claim 2, wherein the pull-down circuit comprises:

a first n-channel field effect transistor (NFET) coupled between the output of the resettable latch and the ground rail, wherein the first NFET includes a gate configured to receive the input data signal;

a second NFET coupled between the output of the resettable latch and the ground rail, wherein the second NFET includes a gate configured to receive the clock signal; and a third NFET coupled between the output of the resettable latch and the ground rail, wherein the third NFET includes a gate configured to receive the reset signal.

15. The apparatus of claim 14, wherein the pull-down circuit further includes a fourth NFET coupled between the second NFET and the ground rail, and wherein the resettable latch further comprises an inverter including an input coupled to the output of the resettable latch and an output coupled to a gate of the fourth NFET.

16. The apparatus of claim 1, wherein the level shifter comprises:

a first p-channel field effect transistor (PFET), a second PFET, and a first n-channel field effect transistor (NFET) coupled in series between an upper voltage rail and a ground rail, wherein the second PFET and the first NFET include gates configured to receive the input data signal;

a first inverter including an input configured to receive the input data signal;

a second inverter including an input configured to receive the reset signal;

a third PFET, a fourth PFET, a second NFET, and a third NFET coupled in series between the upper voltage rail and the ground rail, wherein: the third PFET includes a gate coupled to a first node between the second PFET and the first PFET, the fourth PFET includes a gate coupled to an output of the first inverter, the second NFET includes a gate coupled to the output of the first inverter, and the third NFET includes a gate coupled to an output of the second inverter; and a fifth PFET including a source coupled to the upper voltage rail and a drain coupled to a second node between the fourth PFET and the second NFET, wherein the fifth PFET includes a gate coupled to the output of the second inverter.

17. A method, comprising:

receiving an input data signal in a first voltage domain;

receiving a reset signal in a second voltage domain;

generating an intermediate signal in the second voltage domain based on the input data signal and the reset signal; and latching an output signal in the second voltage domain at an output in response to receiving the input data signal, the intermediate signal, the reset signal, and a clock signal in the second voltage domain, the output signal being based on logic states of the input data signal, the intermediate signal, the reset signal, and the clock signal, respectively.

18. The method of claim 17, wherein latching the output signal comprises latching the output signal as a logic one (1) in response to the clock signal transitioning to a logic zero (0) when the input data signal and the intermediate signal are both at a logic zero (0).

19. The method of claim 17, wherein latching the output signal comprises latching the output signal as a logic zero (0) in response to the clock signal transitioning to a logic one (1) when the input data signal and the intermediate signal are both at a logic one (1).

20. The method of claim 17, further comprising setting the output to a logic zero (0) in response to the reset signal becoming asserted.

* * * * *